(12) United States Patent
Nishimata et al.

(10) Patent No.: US 10,927,298 B2
(45) Date of Patent: Feb. 23, 2021

(54) NITRIDE FLUORESCENT MATERIAL, METHOD FOR PRODUCING THE SAME, AND LIGHT EMITTING DEVICE

(71) Applicant: NICHIA CORPORATION, Anan (JP)

(72) Inventors: Kazuya Nishimata, Anan (JP); Hiroyuki Watanabe, Itano-gun (JP); Shoji Hosokawa, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 16/854,507

(22) Filed: Apr. 21, 2020

(65) Prior Publication Data

US 2020/0248072 A1 Aug. 6, 2020

Related U.S. Application Data

(60) Continuation of application No. 15/916,938, filed on Mar. 9, 2018, now Pat. No. 10,662,375, which is a
(Continued)

(30) Foreign Application Priority Data

Aug. 28, 2015 (JP) .............................. JP2015-169327
Jul. 19, 2016 (JP) .............................. JP2016-141227

(51) Int. Cl.
| | |
|---|---|
| C09K 11/77 | (2006.01) |
| C09K 11/08 | (2006.01) |
| H01L 33/50 | (2010.01) |
| H01L 33/32 | (2010.01) |
| H01L 33/48 | (2010.01) |

(Continued)

(52) U.S. Cl.
CPC ...... *C09K 11/7734* (2013.01); *C09K 11/0833* (2013.01); *C09K 11/0883* (2013.01); *H01L 33/32* (2013.01); *H01L 33/486* (2013.01); *H01L 33/502* (2013.01); *H01L 33/504* (2013.01); *H01L 33/56* (2013.01); *H01L 33/62* (2013.01); *H01L 2224/48091* (2013.01); *H01L 2224/48247* (2013.01); *H01L 2224/48257* (2013.01);
(Continued)

(58) Field of Classification Search
None
See application file for complete search history.

(56) References Cited

U.S. PATENT DOCUMENTS

| | | |
|---|---|---|
| 8,471,283 B2 | 6/2013 | Ishii et al. |
| 2006/0033083 A1 | 2/2006 | Sakane et al. |

(Continued)

FOREIGN PATENT DOCUMENTS

| | | |
|---|---|---|
| EP | 2610217 A1 | 7/2013 |
| JP | H1140066 A | 2/1999 |

(Continued)

OTHER PUBLICATIONS

Extended European Search Report dated Nov. 18, 2016, in European Application No. 16184714.0-1375.
(Continued)

*Primary Examiner* — Bo B Jang
(74) *Attorney, Agent, or Firm* — Hunton Andrews Kurth LLP

(57) ABSTRACT

A method for producing a nitride fluorescent material having high emission luminance can be provided. The method includes heat-treating a raw material mixture containing silicon nitride, silicon, an aluminium compound, a calcium compound, and a europium compound.

10 Claims, 3 Drawing Sheets

Related U.S. Application Data division of application No. 15/247,083, filed on Aug. 25, 2016, now Pat. No. 9,944,851.

(51) Int. Cl.
 *H01L 33/56* (2010.01)
 *H01L 33/62* (2010.01)

(52) U.S. Cl.
 CPC ............... *H01L 2224/73265* (2013.01); *H01L 2933/0041* (2013.01)

(56) References Cited

U.S. PATENT DOCUMENTS

| | | |
|---|---|---|
| 2007/0007494 A1 | 1/2007 | Hirosaki et al. |
| 2008/0290785 A1 | 11/2008 | Schmidt et al. |
| 2009/0121615 A1 | 5/2009 | Le Toquin |
| 2009/0267485 A1 | 10/2009 | Nagatomi et al. |
| 2010/0038590 A1 | 2/2010 | Suzuki et al. |
| 2011/0006334 A1 | 1/2011 | Ishii et al. |
| 2013/0140490 A1 | 6/2013 | Fujinaga et al. |
| 2014/0284649 A1 | 9/2014 | Baumgartner et al. |

FOREIGN PATENT DOCUMENTS

| | | |
|---|---|---|
| JP | 2006-008721 A | 1/2006 |
| JP | 2007-031201 A | 2/2007 |
| JP | 2007070445 A | 3/2007 |
| JP | 2007291352 A | 11/2007 |
| JP | 2008007751 A | 1/2008 |
| JP | 2008106224 A | 5/2008 |
| JP | 2008255199 A | 10/2008 |
| JP | 2008303331 A | 12/2008 |
| JP | 2009132917 A | 6/2009 |
| JP | 2009221317 A | 10/2009 |
| JP | 2010043242 A | 2/2010 |
| JP | 2011-012091 A | 1/2011 |
| JP | 2013-012784 A | 1/2013 |
| JP | 2013201434 A | 10/2013 |
| JP | 2014529912 A | 11/2014 |
| TW | 1394815 B | 5/2013 |
| WO | 2005103199 A1 | 11/2005 |
| WO | 2007037059 A1 | 4/2007 |
| WO | 2007052200 A1 | 5/2007 |

OTHER PUBLICATIONS

H.-S. Kim et al., "Synthesis and Luminescence Properties of (Sr,Ca)AlSiN3:Eu2+ Phosphors under Atmospheric-Pressure," ECS Journal of Solid State Science and Technology, 3(12) R234-R237 (2014).

Particle Analytical, 4 pages.

NITRIDE FLUORESCENT MATERIAL, METHOD FOR PRODUCING THE SAME, AND LIGHT EMITTING DEVICE

CROSS-REFERENCE TO RELATED APPLICATION

This is a Continuation of U.S. application Ser. No. 15/916,938 filed Mar. 9, 2018, which is a Divisional of U.S. application Ser. No. 15/247,083 filed Aug. 25, 2016, which claims priority to Japanese Patent Application No. 2015-169327, filed on Aug. 28, 2015 and Japanese Patent Application No. 2016-141227, filed on Jul. 19, 2016, the entire disclosures of which are incorporated herein by reference.

BACKGROUND OF THE INVENTION

Field of the Invention

The present disclosure relates to a nitride fluorescent material, a method for producing the nitride fluorescent material, and a light emitting device.

Description of the Related Art

Light emitting devices have been developed that emit white light by incorporating in combination a blue light emitting LED (Light Emitting Diode) as a light emitting element, a fluorescent material emitting green light when excited by the blue light, and a fluorescent material emitting red light when excited by the blue light. For instance, Japanese patent application JP 2008-303331 A describes a light emitting device that emits white light by incorporating in combination a β sialon fluorescent material having a β-type $Si_3N_4$ crystalline structure, and emitting green light; a nitride fluorescent material having a composition of $CaAlSiN_3$:Eu and emitting red light (hereinafter also referred to as "CASN fluorescent material"); and a blue LED.

A red light emitting fluorescent material (hereinafter also referred to as "SCASN fluorescent material") having a composition of $(Ca,Sr)AlSiN_3$:Eu obtained by partially replacing Ca with Sr in a CASN fluorescent material is known. A SCASN fluorescent material is said to have a peak emission wavelength shorter than the peak emission wavelength of a CASN fluorescent material. A CASN fluorescent material can be obtained by, for instance, calcinating a mixture comprising silicon nitride, aluminium nitride, calcium nitride, and europium nitride. A SCASN fluorescent material can also be obtained in the same manner as a CASN fluorescent material (see, for instance, JP 2006-8721 A).

SUMMARY OF INVENTION

A method for producing a nitride fluorescent material having high emission luminance can be provided. The method includes heat-treating a raw material mixture containing silicon nitride, elemental silicon, an aluminium compound, a calcium compound, and a europium compound.

DETAILED DESCRIPTION OF THE EMBODIMENT

Figure 1:
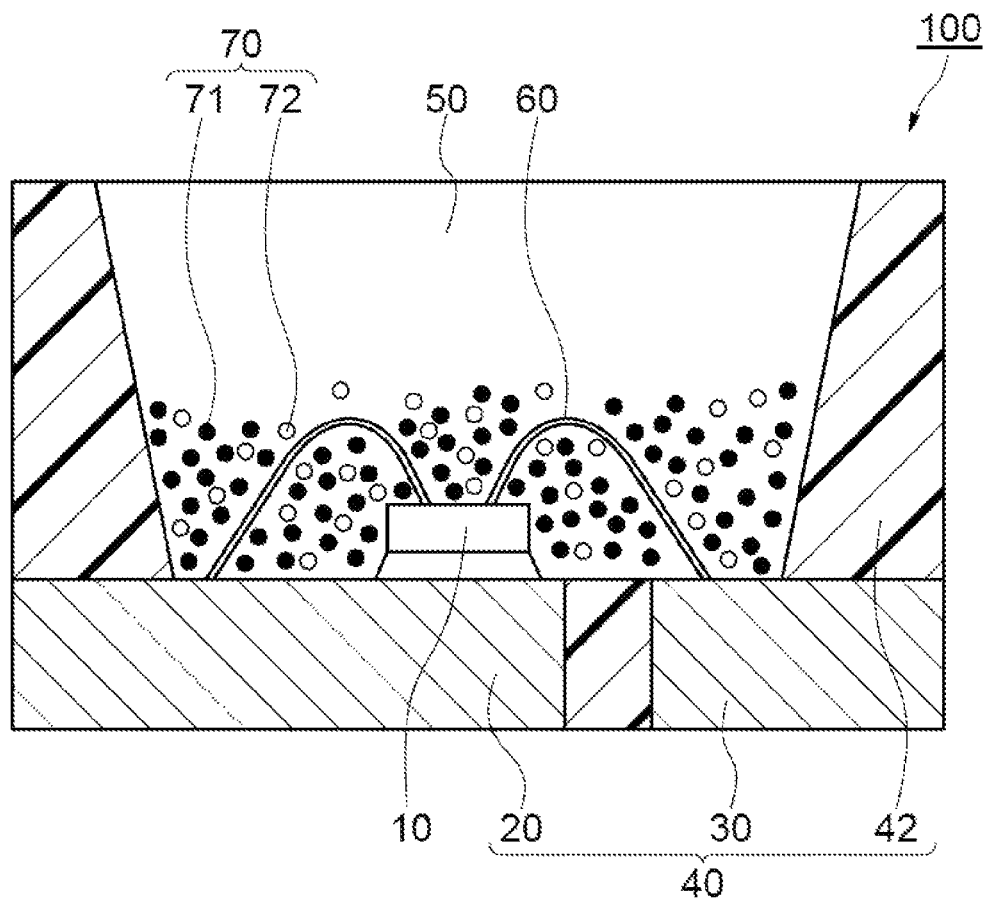
FIG. 1 is a schematic sectional view showing an example of a light emitting device.

A method for producing a nitride fluorescent material of the present invention will be described below with reference to embodiments. The embodiments shown below, however, exemplify the technical concept of the present invention, and the present invention is not limited to the following method for producing a nitride fluorescent material. The relationship between the color names and the chromaticity coordinates, the relationship between the wavelength ranges of light and the color names of monochromatic light, and others are in accordance with Japanese Industrial Standard (JIS) Z8110. As used herein, the term "step" means not only an independent step but also a step which cannot be clearly distinguished from the other steps but can achieve the anticipated effect of that step. Further, for the amount of each component contained in a composition, when a plurality of substances corresponding to the component exist, the amount of the component means the total amount of the substances present in the composition unless otherwise specified.

[Method for Producing a Nitride Fluorescent Material]

The method for producing a nitride fluorescent material includes heat-treating a raw material mixture containing silicon nitride, elemental silicon, an aluminium compound, a calcium compound, and a europium compound. The nitride fluorescent material has a composition represented by, for instance, formula (I).

$$Sr_sCa_tAl_uSi_vN_w:Eu \quad (I)$$

In the formula (I), s, t, u, v, and w respectively satisfy $0.0 \leq s < 1$, $0 < t \leq 1$, $s+t \leq 1$, $0.9 \leq u \leq 1.1$, $0.9 \leq v \leq 1.1$, and $2.5 \leq w \leq 3.5$.

The raw material mixture contains elemental silicon as well as silicon nitride as a silicon source. Although the details are unknown, when heat treated, elemental silicon is believed to react while undergoing nitridization. Because of this, sintering due to heat treatment at a high temperature is believed less likely to occur. Thus, a nitride fluorescent material of a large particle diameter can be obtained. The resultant nitride fluorescent material has high emitting efficiency and improved emitting luminance.

The raw material mixture contains silicon nitride, elemental silicon, at least one aluminium compound, and at least one europium compound.

The silicon nitride is a silicon compound containing a nitrogen atom and silicon atom, and may contain an oxygen atom. When the silicon nitride contains an oxygen atom, the oxygen atom may be contained in the form of a silicon oxide or in the form of an oxynitride of silicon.

The content of the oxygen atom in the silicon nitride may be, for instance, less than 2% by weight, or 1.5% by weight or less. The content of the oxygen atom may be also, for instance, 0.3% by weight or more, or 0.4% by weight or more. When the amount of oxygen is equal to or greater than a predetermined value, the reactivity may be increased, and the particle growth may be promoted. When the amount of oxygen is equal to or less than a predetermined amount, excessive sintering of the fluorescent material particles may be suppressed, improving the shapes of the fluorescent material particles to be produced.

The purity of the silicon nitride may be, for instance, 95% by weight or more, or 99% by weight or more. When the purity of the silicon nitride is equal to or greater than a predetermined value, the influence of impurities may be minimized, leading to further improved emitting luminance of the nitride fluorescent material to be produced.

The average particle diameter of the silicon nitride may be, for instance, from 0.1 μm to 15 μm, or from 0.1 μm to 5 μm. When the average particle diameter of the silicon nitride is equal to or less than a predetermined value, the reactivity during production of the nitride fluorescent material may be improved. When the average particle diameter of the silicon nitride is equal to or greater than a predetermined value, excessive reaction during production of the nitride fluorescent material may be suppressed, which suppresses sintering of the fluorescent material particles to be produced.

The silicon nitride may be appropriately selected from commercially available products, or may be produced by nitriding silicon. The silicon nitride can be obtained, for instance, by grinding silicon to be used as a raw material in an inert gas atmosphere such as rare gas and nitrogen gas, and heat-treating the resultant powder in a nitrogen atmosphere so that the powder is nitrided. The elemental silicon to be used as the raw material preferably has high purity, and the purity may be, for instance, 3 N (99.9% by weight) or more. The average particle diameter of the ground silicon may be, for instance, from 0.1 μm to 15 μm. The heat-treating temperature may be, for instance, from 800° C. to 2000° C., and the time for heat-treating may be, for instance, from 1 hour to 20 hours. The resultant silicon nitride may undergo, for instance, grinding treatment in a nitrogen atmosphere.

The silicon as a component of the raw material mixture is elemental silicon. The purity of the silicon may be, for instance, 95% by weight or more, or 99.9% by weight or more. When the purity of the silicon is equal to or greater than a predetermined value, the influence of impurities may be minimized, leading to further improved luminance of the fluorescent material to be produced.

The average particle diameter of the silicon may be, for instance, from 0.1 μm to 100 μm, or from 0.1 μm to 80 μm. When the average particle diameter of the silicon nitride is equal to or less than a predetermined value, complete nitriding into the inside of the particles may be achieved. When the average particle diameter of the silicon is equal to or greater than a predetermined value, excessive reaction during production of the nitride fluorescent material may be suppressed, and thus sintering of the fluorescent material particles may be suppressed.

A portion of silicon nitride and elemental silicon in the raw material mixture may be replaced with another silicon compound, such as silicon oxide. That is, the raw material mixture may contain a silicon compound such as silicon oxide in addition to silicon nitride and elemental silicon. Examples of the silicon compound include silicon oxide, silicon oxynitride, and silicate.

A portion of silicon nitride and elemental silicon in the raw material mixture may be replaced with a metal compound, a simple metal, or an alloy of elements from Group IV of the periodic table, such as germanium, tin, titanium, zirconium, and hafnium. Examples of the metal compound include oxide, hydroxide, nitride, oxynitride, fluoride, and chloride.

The weight percentage of the silicon relative to the total amount of the silicon nitride and silicon in the raw material mixture may be, for instance, from 10% by weight to 85% by weight, from 20% by weight to 80% by weight, or from 30% by weight to 80% by weight. When the weight percentage of the silicon is equal to or greater than a predetermined value, sintering of the particles during particle growth of the nitride fluorescent material may be suppressed. Furthermore, since silicon nitride has an effect of accelerating nitriding reaction of silicon, incorporating a predetermined weight percentage or less of silicon (to have a greater weight percentage of the silicon nitride) leads to sufficient nitriding of silicon.

Examples of the aluminium compound include an aluminium-containing oxide, hydroxide, nitride, oxynitride, fluoride, and chloride. In place of at least a portion of the aluminium compound, for instance, simple aluminium metal or an aluminium alloy may be used. Specific examples of the aluminium compound include aluminium nitride (AlN), aluminium oxide ($Al_2O_3$), and aluminium hydroxide (Al$(OH)_3$), and it is preferable to use at least one selected from the group consisting of these, and it is more preferable to use aluminium nitride. Since aluminium nitride is composed only of the elements to be contained in the target fluorescent material composition, introduction of impurities can be prevented more effectively. Compared to, for instance, an aluminium compound containing oxygen or hydrogen, aluminium nitride can reduce the influence of these elements, and needs no nitriding reaction unlike simple metals. These aluminium compounds may be used individually, or two or more of them may be used in combination.

The average particle diameter of the aluminium compound to be used as a raw material may be, for instance, from 0.1 μm to 15 μm, or from 0.1 μm to 10 μm. When the average particle diameter of the aluminium compound is equal to or less than a predetermined value, the reactivity during production of the nitride fluorescent material may be improved. When the average particle diameter of the aluminium compound is equal to or greater than a predetermined value, sintering of the fluorescent material particles during production of the nitride fluorescent material may be suppressed.

The purity of the aluminium compound may be, for instance, 95% by weight or more, or 99% by weight or more. When the purity of the aluminium compound is equal to or greater than a predetermined value, the influence of impurities may be minimized, leading to further improved light emitting luminance of the fluorescent material.

The aluminium compound may be appropriately selected from commercially available products, or a desired aluminium compound may be produced. For instance, the aluminium nitride may be produced by, for example, the direct nitriding method of aluminium.

At least a portion of the aluminium compound in the raw material mixture may be replaced with a metal compound, a simple metal, or an alloy of elements from Group III of the periodic table, such as gallium, indium, vanadium, chrome, and cobalt. Examples of the metal compound include oxide, hydroxide, nitride, oxynitride, fluoride, and chloride.

Examples of the calcium compound may include calcium-containing hydrogen oxide, oxide, hydroxide, nitride, oxynitride, fluoride, and chloride. In place of at least a portion of the calcium compound, for instance, a simple calcium metal or an alloy of calcium may be used. Specific examples of the calcium compound include inorganic compounds such as calcium hydride ($CaH_2$), calcium nitride ($Ca_3N_2$), calcium oxide (CaO), calcium hydroxide ($Ca(OH)_2$), and salts of organic compounds such as an imide compound and an amide compound. It is preferable to use at least one selected from the group consisting of these, and calcium nitride is more preferable. Since calcium nitride is composed only of the elements to be contained in the composition of the target fluorescent material, introduction of impurities can be prevented more effectively. Compared to, for instance, a calcium compound containing oxygen or hydrogen, calcium nitride can reduce the influence of these elements, and needs no nitriding reaction unlike simple metals. These calcium compounds may be used individually, or two or more of them may be used in combination.

The average particle diameter of the calcium compound to be used as a raw material may be, for instance, from 0.1 μm to 100 μm, or from 0.1 μm to 80 μm. When the average particle diameter of the calcium compound is equal to or less than a predetermined value, the reactivity during production of the nitride fluorescent material may be improved. When the average particle diameter of the calcium compound is equal to or greater than a predetermined value, sintering of the nitride fluorescent material particles during production of the nitride fluorescent material may be suppressed.

The purity of the calcium compound may be, for instance, 95% by weight or more, or 99% by weight or more. When the purity is equal to or greater than a predetermined value, the influence of impurities may be minimized, leading to further improved light emitting luminance of the fluorescent material.

The calcium compound may be appropriately selected from commercially available products, or a desired calcium compound may be produced. For instance, calcium nitride may be obtained by grinding calcium to be used as a raw material in an inert gas atmosphere, and heat-treating the resultant powder in a nitrogen atmosphere so that the powder is nitrided. The calcium to be used as a raw material is preferably highly pure, and the purity may be, for instance, 2 N (99% by weight) or more. The average particle diameter of ground calcium may be, for instance, from 0.1 μm to 15 μm. The heat-treating temperature is, for instance, from 600° C. to 900° C., and the time for heat-treating may be, for instance, from 1 hour to 20 hours. The resultant calcium nitride may undergo, for instance, grinding treatment in an inert gas atmosphere.

At least a portion of calcium compound in the raw material mixture may be replaced with a metal compound, a simple metal, an alloy, or the like of alkaline earth metals such as magnesium and barium; alkali metals such as lithium, sodium, and potassium; and elements from Group III of the periodic table, such as boron and aluminium. Examples of the metal compound include hydride, oxide, hydroxide, nitride, oxynitride, fluoride, and chloride.

Examples of the europium compounds include europium-containing oxide, hydroxide, nitride, oxynitride, fluoride, and chloride. In place of at least a portion of the europium compound, for instance, a simple europium metal or an alloy of europium may be used. Specific examples of the europium compound include europium oxide ($Eu_2O_3$), europium nitride (EuN), and europium fluoride ($EuF_3$). At least one selected from the group consisting of these is preferable, and europium oxide is more preferable. Since europium nitride (EuN) is composed only of the elements to be contained in the target composition of the fluorescent material, introduction of impurities can be more effectively prevented. Furthermore, since europium oxide ($Eu_2O_3$) and europium fluoride ($EuF_3$) also serve as a flux, these are preferably used. These europium compounds may be used individually, or two or more of them may be used in combination.

The average particle diameter of the europium compound to be used as a raw material may be, for instance, from 0.01 μm to 20 μm, or from 0.05 μm to 10 μm. When the average particle diameter of the europium compound is equal to or greater than a predetermined value, agglomeration of the fluorescent material particles during production may be suppressed. When the average particle diameter of the europium compound is equal to or less than a predetermined value, more uniformly activated fluorescent material particles can be obtained.

The purity of the europium compound may be, for instance, 95% by weight or more, or 99.5% by weight or more. When the purity of the europium compound is equal to or greater than a predetermined value, the influence of impurities may be minimized, leading to further improved light emitting luminance of the fluorescent material.

The europium compound may be appropriately selected from commercially available products, or a desired europium compound may be produced. For instance, the europium nitride may be produced by grinding europium to be used as a raw material in an inert gas atmosphere, and heat-treating the resultant powder in a nitrogen atmosphere so that the powder is nitrided. The average particle diameter of the ground europium may be, for instance, from 0.1 μm to 10 μm. The heat-treating temperature may be, for instance, from 600° C. to 1200° C., and the time for heat-treating may be, for instance, from 1 hour to 20 hours. The resultant europium nitride may undergo, for instance, grinding treatment in an inert gas atmosphere.

At least a portion of the europium compound in the raw material mixture may be replaced with a metal compound, a simple metal, or an alloy of rare-earth elements, such as scandium (Sc), yttrium (Y), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), and lutetium (Lu). Examples of the metal compound include oxide, hydroxide, nitride, oxynitride, fluoride, and chloride.

A portion of the calcium compound in the raw material mixture may be replaced with a strontium compound, metal strontium, or an alloy of strontium as necessary. Examples of the strontium compound include strontium-containing hydride, oxide, hydroxide, nitride, oxynitride, fluoride, and chloride.

The strontium compound may be appropriately selected from commercially available products, or a desired strontium compound may be produced. For instance, strontium nitride may be produced in the same manner as calcium nitride. Unlike calcium nitride, strontium nitride is likely to take any amount of nitrogen, and is represented by $SrN_x$. In the formula, x is, for instance, from 0.5 to 1.

In a raw material mixture containing a strontium atom, the ratio of the number of strontium atom in the total amount of calcium atom and strontium atom in the raw material mixture may be, for instance, from 0.1% by mol to 99.9% by mol, and preferably from 0.1% by mol to 98% by mol. When the content of the strontium atom is in this range, a desired value of peak emission wavelength of the nitride fluorescent material may be achieved.

The mixing ratio of silicon nitride, silicon, an aluminium compound, a calcium compound, and a europium compound in the raw material mixture is not particularly limited as long as the nitride fluorescent material having a composition represented by formula (I) is obtained, and may be appropriately selected according to a desired composition. For instance, the molar ratio of silicon atom to aluminium atom in the raw material mixture is u:v, and may be from 0.9:1.1 to 1.1:0.9. The molar ratio of calcium atom (optionally strontium atom is contained) to aluminium atom is (s+t):u, and may be 0.9:1 to 1.11:1. The molar ratio of the europium atom in the total molar amount of calcium atom (optionally strontium atom is contained) and europium atom may be, for instance, 1:0.05 to 1:0.001, or 1:0.03 to 1:0.003.

For instance, mixing calcium nitride, europium oxide, aluminium nitride, silicon nitride, and silicon to prepare a raw material mixture having a composition ratio of Ca:Eu:Al:Si=0.993:0.007:1:1, and heat-treating the raw material mixture by a method described later can produce a nitride fluorescent material represented by:

$$Ca_{0.993}Eu_{0.007}AlSiN_3.$$

The composition of the nitride fluorescent material, however, is a representative composition estimated by the mixing ratio of the raw material mixture. Since europium oxide is used and each raw material contains about 1% by weight of oxygen, the actual fluorescent material to be obtained may contain a certain amount of oxygen. To show a representative composition, the chemical formula given above does not contain such oxygen. The resulting composition may slightly differ from the initial composition because a portion of the raw materials may degrade and scatter out while undergoing heat treatment. By changing the mixing ratio of each raw material, however, the composition of the target nitride fluorescent material may be changed. Although an explanation is made here using a composition containing no strontium, needless to say, the same can be said about a composition containing strontium.

The raw material mixture may further contain a separately prepared composition (nitride fluorescent material) represented by formula (I) as necessary. When a raw material mixture contains a nitride fluorescent material, the content may be, for instance, from 1% by weight to 50% by weight in the total amount of the raw material mixture.

The raw material mixture may contain a flux such as a halide as necessary. In a raw material containing a flux, the reaction between raw materials may be further accelerated, and the solid phase reaction may proceed more uniformly, so that a fluorescent material having a large particle diameter and superior light emitting properties can be obtained. This is, for instance, believed to be due to the fact that the temperature of heat treatment in the preparation step is equal to or greater than the temperature for generating a liquid phase such as halide, which is a flux. Examples of the halide include chlorides and fluorides of rare earth metals, alkali earth metals, and alkali metals. The flux may be added as a compound that helps the element ratio of the cations to achieve the target composition, or may be further added as an additive after various materials are added to make up the target composition. When the raw material mixture contains a flux, an amount of a flux may be, for instance, 20% by weight or less, or 10% by weight or less. The content is also, for instance, 0.1% by weight or more. A flux in such an amount can accelerate reaction without lowering the emitting luminance of the fluorescent material.

The raw material mixture may be obtained by weighing desired material compounds in a desired compounding ratio, and then mixing the material compounds by a mixing method using a ball mill, or a mixing method using a mixing machine, such as a Henschel mixer or a V-blender, or using a mortar and a pestle. The mixing may be dry mixing or wet mixing by adding, for instance, a solvent.

The temperature of the heat treatment of the raw material mixture is, for instance, 1200° C. or more, 1500° C. or more, or 1900° C. or more. The heat-treating temperature is also, for instance, 2200° C. or less, 2100° C. or less, or 2050° C. or less. Heat treatment at a temperature of 1200° C. or more may allow easier incorporation of Eu into the crystal, and efficient formation of a desired nitride fluorescent material. Heat treatment at a temperature of 2200° C. or less is likely to suppress degradation of the resulting nitride fluorescent material.

The atmosphere in the heat treatment of the raw material mixture is, for instance, a nitrogen gas-containing atmosphere, or substantially a nitrogen gas atmosphere. A nitrogen gas-containing atmosphere may allow nitriding of silicon contained in the raw material. A nitrogen gas-containing atmosphere also suppresses degradation of nitride, which is a raw material, and the fluorescent material. When the atmosphere in the heat treatment of the raw material mixture contains a nitrogen gas, the atmosphere may contain another gas, such as hydrogen, rare gas such as argon, carbon dioxide, carbon monoxide, oxygen, or ammonia, in addition to nitrogen gas. The content of the nitrogen gas in the heat treating atmosphere of the raw material mixture may be, for instance, 90% by volume or more, or 95% by volume or more. When the content of gases containing elements other than nitrogen is equal to or less than a predetermined value, the possibility for these gaseous components to form impurities and lower the light emitting luminance of fluorescent material is further reduced.

The pressure in the heat treatment of the raw material mixture may be, for instance, from ordinary pressure to 200 MPa. To suppress degradation of the nitride fluorescent material to be generated, the pressure may be high, for instance, from 0.1 MPa to 200 MPa, or from 0.6 MPa to 1.2 MPa for less restrictions on industrial equipment.

Heat treatment of the raw material mixture may be performed at a single temperature, or by multiple stages including two or more heat-treating temperatures. Heat treatment by multiple stages, for instance, includes performing a first-stage heat treatment at 800° C. to 1400° C., elevating the temperature slowly, and then performing a second-stage heat treatment at 1500° C. to 2100° C.

In the heat treatment of the raw material mixture, the heat treatment is performed, for instance, by elevating the temperature from room temperature to a predetermined temperature. The time for elevating the temperature may be, for instance, from 1 hour to 48 hours, from 2 hours to 24 hours, or from 3 hours to 20 hours. When the time for elevating the temperature is 1 hour or more, the fluorescent material particles are likely to fully grow, and Eu is likely to be easily incorporated into the crystals of the fluorescent material particles.

In the heat treatment of the raw material mixture, a retention time at a predetermined temperature may be provided. The retention time may be, for instance, from 0.5 hour to 48 hours, from 1 hour to 30 hours, or from 2 hours to 20 hours. With a retention time of a predetermined value or more, more uniform particle growth may be further accelerated. With a retention time of a predetermined value or less, degradation of the fluorescent material may be further suppressed.

The time for lowering the temperature from a predetermined temperature to room temperature in the heat treatment of the raw material mixture may be, for instance, from 0.1 hour to 20 hours, from 1 hour to 15 hours, or from 3 hours to 12 hours. A retention time may be provided at an appropriately selected temperature while the temperature is lowered from a predetermined temperature to room temperature. This retention time may be, for instance, adjusted to further enhance the light-emitting luminance of the nitride fluorescent material. The retention time at a predetermined temperature while the temperature is lowered may be, for instance, from 0.1 hour to 20 hours, or from 1 hour to 10 hours. The temperature during the retention time may be, for instance, from 1000° C. to less than 1800° C., or from 1200° C. to 1700° C.

The raw material mixture may be heat-treated, for instance, in a gas pressurized electric furnace. Heat treatment of the raw material mixture may be performed, for instance, by charging the raw material mixture into a crucible or boat made of a carbon material, such as black lead, or of a boron nitride (BN) material. Besides carbon materials or boron nitride materials, alumina ($Al_2O_3$) or Mo materials, for example, may be used. A crucible or boat made of boron nitride is particularly preferable.

After the heat treatment of the raw material mixture, a sizing step including operations in combination of crushing, grinding, and classifying a nitride fluorescent material resulting from the heat treatment, may be performed. A powder of a desired particle diameter can be obtained by the sizing step. Specifically, after roughly grinding a nitride fluorescent material, the roughly ground particles may be ground using a common grinder, such as a ball mill, a jet mill, and a vibration mill to have a predetermined particle diameter. Excessive grinding, however, may cause defects on the surface of the fluorescent material particles, resulting in luminance decrease. When particles having different particle diameters are present after grinding, the particle diameters may be made uniform by classifying the particles.

[Nitride Fluorescent Material]

The present disclosure encompasses a nitride fluorescent material produced by the above-described production method. The nitride fluorescent material may contain an alkali earth metal, aluminium, silicon, and europium, or the nitride fluorescent material may have a composition represented by formula (I). As a result of the raw material mixture containing silicon and silicon nitride in combination, sintering of the nitride fluorescent material in the heat treatment during the production may be suppressed, achieving a larger particle diameter and thus higher luminance.

The nitride fluorescent material is, for instance, a red-light emitting fluorescent material that absorbs light in the range of from 200 nm to 600 nm, and emits light having a peak emission wavelength in the range of from 605 nm to 670 nm. The excitation wavelength of the nitride fluorescent material may fall within the range of from 420 nm to 470 nm. The half bandwidth in the light emission spectrum of the nitride fluorescent material may be, for instance, from 70 nm to 95 nm.

The specific surface area of the nitride fluorescent material may be, for instance, less than 0.3 $m^2/g$, 0.27 $m^2/g$ or less, 0.2 $m^2/g$ or less, 0.16 $m^2/g$ or less, 0.15 $m^2/g$ or less, or 0.13 $m^2/g$ or less. The specific surface area may be also, for instance, 0.05 $m^2/g$ or more, or 0.1 $m^2/g$ or more. When the specific surface area is less than 0.3 $m^2/g$, the nitride fluorescent material is likely to have further improved light absorption and conversion efficiency, achieving higher luminance.

The specific surface area of the nitride fluorescent material is measured by the Brunauer-Emmett-Teller (BET) method. Specifically, the specific surface area is calculated by the dynamic constant-pressure method using Gemini 2370 manufactured by Shimadzu Corporation.

The average particle diameter of the nitride fluorescent material may be, for instance, 15 μm or more, 18 μm or more, or 20 μm or more. The average particle diameter may be, for instance, 30 μm or less, or 25 μm or less. When the average particle diameter is 15 μm or more, light absorption and conversion efficiency are likely to be further improved, achieving still higher luminance. When the average particle diameter is 30 μm or less, it is likely that the nitride fluorescent material is handled more easily, and the productivity of a light emitting device containing the nitride fluorescent material is likely to be further improved. The average particle diameter of the nitride fluorescent material may be, for instance, in the range of from 15 μm to 30 μm. Preferably, the fluorescent material contains particles of this mean particle diameter at high frequency. The particle sizes are also preferably distributed in a narrow range. A light emitting device including a nitride fluorescent material with less variation in particle diameter and particle size distribution has less color unevenness, and thus has favorable color tone.

The average particle diameter of the nitride fluorescent material is Fisher Sub Sieve Sizer's No. (F.S.S.S.N.) obtained by the air permeability method using Fisher Sub Sieve Sizer. Specifically, this is a value obtained by measuring each sample of 1 $cm^3$ under the conditions of an atmospheric temperature of 25° C. and a humidity of 70% RH, packing each sample into a dedicated tubular container, to which dry air at a given pressure is introduced, and a specific surface area is read from the difference in pressure and converted to an average particle diameter.

To improve emitting luminance, the nitride fluorescent material may have a specific surface area of less than 0.3 $m^2/g$ by the BET method and an average particle diameter of 18 μm or more, or a specific surface area of 0.2 $m^2/g$ or less and an average particle diameter of 20 μm or more, or a specific surface area of 0.16 $m^2/g$ or less and an average particle diameter of 20 μm or more. The nitride fluorescent material may have a specific surface area of 0.1 $m^2/g$ or more, and an average particle diameter of 30 μm or less, or 25 μm or less.

To improve emitting luminance, the nitride fluorescent material is a nitride containing an alkali earth metal, aluminium, silicon, and europium, and may have a specific surface area by the BET method of 0.1 $m^2/g$ to 0.16 $m^2/g$ and an average particle diameter of from 20 μm to 30 μm. The nitride fluorescent material may have a composition represented by formula (I) and a specific surface area by the BET method of from 0.1 $m^2/g$ to 0.16 $m^2/g$ and an average particle diameter of from 20 μm to 30 μm. To improve emitting luminance, the nitride fluorescent material is a nitride containing an alkali earth metal, aluminium, silicon, and europium, and may have a specific surface area by the BET method of from 0.1 $m^2/g$ to 0.15 $m^2/g$ and an average particle diameter of from 20 μm to 30 μm. Or the nitride fluorescent material may have a composition of formula (I) wherein s=0, a specific surface area by the BET method of from 0.1 $m^2/g$ to 0.15 $m^2/g$, and an average particle diameter of from 20 μm to 30 μm.

The nitride fluorescent material may have a high crystalline structure in at least a portion thereof. For instance, since a glass body (amorphous) is of an irregular and less crystalline structure, the reaction conditions in the production process of a fluorescent material must be controlled to be strictly uniform. Otherwise, the ratio of components in the resultant fluorescent material varies, which is likely to cause chromaticity unevenness, for example. In contrast, the nitride fluorescent material according to the present embodiment is a powder or a granule having high crystallinity in at least a portion thereof, and thus may be easily produced and processed. In addition, the nitride fluorescent material can be uniformly dispersed in an organic medium, so that light emitting plastics and polymeric thin film materials, for example, can be readily produced. Specifically, the nitride fluorescent material may be a crystalline structure in, for instance, 50% by weight or more, or 80% by weight or more. This indicates the proportion of a crystalline phase having light emission properties, and the presence of a crystalline phase of 50% by weight or more may ensure emission of light enough for practical use. Thus the emitting luminance and ease of processability increase with the proportion of the crystalline phase.

[Light Emitting Device]

The present disclosure encompasses a light emitting device incorporating the nitride fluorescent material. The light emitting device at least includes a light emitting element having a peak emission wavelength in the range of, for instance, from 380 nm to 470 nm; and a fluorescent member containing at least a first fluorescent material including the nitride fluorescent material. The fluorescent member may further contain a second fluorescent material that emits green to yellow light. The light emitted by the light emitting device is a mix of light from the light emitting element and fluorescence from the fluorescent member. For instance, the light may have chromaticity coordinates defined by CIE 1931 of x=0.220 to 0.340 and y=0.160 to 0.340, or x=0.220 to 0.330 and y=0.170 to 0.330.

An example of a light emitting device 100 according to an embodiment of the present disclosure will be described with reference to the drawings. FIG. 1 is a schematic sectional view of an example of a light emitting device 100 according to the present disclosure. A light emitting device 100 is an example of a surface mounting type light emitting device.

The light emitting device 100 includes a nitride gallium compound semiconductor-light emitting element 10 that emits visible light at short wavelengths (e.g., in the range of from 380 nm to 485 nm) and has a peak emission wavelength of, for instance, from 440 nm to 460 nm, and a molded body 40 on which the light emitting element 10 is disposed. The molded body 40 includes a first lead 20, a second lead 30, and a resin portion 42, which are formed in an integral manner. Alternatively, a molded body 40 may be formed by a known method using a ceramic as a material in place of the resin portion 42. The molded body 40 has a recess defined by a bottom surface and side surfaces, and the light emitting element 10 is disposed on the bottom surface of the recess. The light emitting element 10 has a pair of electrodes, positive and negative, and the positive and negative electrodes are electrically connected to the first lead 20 and the second lead 30, respectively, with a wire 60. The light emitting element 10 is covered with a fluorescence member 50. The fluorescence member 50 contains, for example, a red light fluorescent material (a first fluorescent material 71) and a green light fluorescent material (a second fluorescent material 72) as a fluoride fluorescent material 70 that converts the wavelength of light emitted from the light emitting element 10, and a resin.

The fluorescence member 50 serves not only as a member containing a fluorescent material 70 for converting the wavelength, but also as a member for protecting the light emitting element 10 and the fluorescent material 70 from the outside environment. In FIG. 1, the particles of the fluorescent material 70 are unevenly dispersed in the fluorescence member 50. Arranging the particles of the fluorescent material 70 closer to the light emitting element 10 in this manner allows efficient conversion of the wavelength of light from the light emitting element 10, thereby providing a light emitting device with superior emitting efficiency. It should be noted that the arrangement of the particles of the fluorescent material 70 and the light emitting element 10 in the fluorescence member 50 is not limited to one in which they are in close proximity to each other, and the particles of the fluorescent material 70 may be arranged spaced apart from the light emitting element 10 within the fluorescence member 50 to avoid the influence of heat on the fluorescent material 70. The particles of the fluorescent material 70 may also be approximately evenly dispersed in the entire fluorescence member 50 so as to obtain light with further reduced color unevenness.

(Light Emitting Element)

The peak emission wavelength of the light emitting element lies in the range of, for instance, from 380 nm to 470 nm, or from 440 nm to 460 nm. Using a light emitting element having a peak emission wavelength in this range as an excitation light source yields a light emitting device that emits light resulting from a mix of the light from the light emitting element and fluorescence from the fluorescent materials. In addition, because this allows effective use of light radiated from the light emitting element to the outside, the loss of light emitted from the light emitting device can be minimized, resulting in a highly efficient light emitting device.

The half bandwidth of the light emission spectrum of the light emitting element may be, for instance, 30 nm or less.

The light emitting element may be a semiconductor light emitting element. Using a semiconductor light emitting element as the excitation light source yields a highly efficient light emitting device that has high output linearity to the input and is resistant and stable to mechanical impact.

For example, as a semiconductor light emitting element, a nitride semiconductor ($In_XAl_YGa_{1-X-Y}N$, wherein $0 \le X$, $0 \le Y$, and $X+Y \le 1$) that emits blue or green light, for example, may be used as the semiconductor light emitting element.

(Fluorescent Member)

The light emitting device includes a fluorescent member that converts a wavelength by absorbing a portion of light emitted from a light emitting element. The fluorescent member contains at least one first fluorescent material that emits red light, and may contain at least one second fluorescent material that emits green to yellow light. Examples of the first fluorescent material include the above-described nitride fluorescent material. For a second fluorescent material, a fluorescent material may be appropriately selected from green light fluorescent materials that emit fluorescence having a peak emission wavelength in the range of from 500 nm to 580 nm. By appropriately selecting the peak emission wavelength, light emission spectrum, and so forth of a second fluorescent material, the properties such as correlated color temperature and color rendering properties of the light emitting device may fall within the desired ranges. The fluorescent member may contain resin in addition to fluorescent materials. A light emitting device may include a fluorescent member that contains a fluorescent material and a resin, and covers a light emitting element.

The details of the nitride fluorescent material contained in the first fluorescent material are as follows. The content of a first fluorescent material in a light emitting device may be, for instance, from 0.1 part by weight to 50 parts by weight, or from 1 parts by weight to 30 parts by weight relative to 100 parts by weight of the resin contained in the fluorescent member.

The second fluorescent material emits fluorescence having peak emission wavelength in the range of, for instance, from 500 nm to 580 nm, or from 520 nm to 550 nm. The second fluorescent material may be one selected from the group consisting of a β sialon fluorescent material having a composition represented by formula (IIa); a silicate fluorescent material having a composition represented by formula (IIb); a halosilicate fluorescent material having a composition represented by formula (IIc); a thiogallate fluorescent material having a composition represented by formula (IId); a rare earth aluminate fluorescent material having a composition represented by formula (IIe); an alkaline earth aluminate fluorescent material represented by formula (IIf); and an alkaline earth phosphate fluorescent material represented by formula (IIg). In particular, containing, as a second fluorescent material, at least one fluorescent material having a composition represented by formula (IIc), (IIe), (IIf) or (IIg) together with a first fluorescent material in a fluorescent member is preferable, because this combination improves color rendering properties of the light emitting device.

$$Si_{6-w}Al_wO_wN_{8-w}:Eu \qquad (IIa)$$

wherein w satisfies $0<w\leq4.2$.

$$(Ba,Sr,Ca,Mg)_2SiO_4:Eu \qquad (IIb)$$

$$(Ca,Sr,Ba)_8MgSi_4O_{16}(F,Cl,Br)_2:Eu \qquad (IIc)$$

$$(Ba,Sr,Ca)Ga_2S_4:Eu \qquad (IId)$$

$$(Y,Lu,Gd)_3(Al,Ga)_5O_{12}:Ce \qquad (IIe)$$

$$(Sr,Ca,Ba)_4Al_{14}O_{25}:Eu \qquad (IIf)$$

$$(Ca,Sr,Ba)_5(PO_4)_3(Cl,Br):Eu \qquad (IIg)$$

In the formula (IIa), w may satisfy $0.01<w<2$.

To improve emitting luminance, the average particle diameter of the second fluorescent material contained in a light emitting device is preferably from 2 μm to 35 μm, or from 5 μm to 30 μm.

The average particle diameter of a second fluorescent material is measured in the same manner as the average particle diameter of a first fluorescent material.

The content of a second fluorescent material in a light emitting device may be, for instance, from 1 part by weight to 70 parts by weight, or from 2 parts by weight to 50 parts by weight relative to 100 parts by weight of the resin contained in the fluorescent member.

The ratio of a first fluorescent material to a second fluorescent material (first fluorescent material/second fluorescent material) in a light emitting device is, for instance, from 0.01 to 10, or from 0.1 to 1 in terms of weight.

Other Fluorescent Materials

The light emitting device may contain another fluorescent material as necessary in addition to a first fluorescent material and a second fluorescent material. Examples of the other fluorescent material include $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, and $K_2(Si,Ti,Ge)F_6:Mn$. When the light emitting device contains other fluorescent materials, the content thereof is, for instance, 10% by weight or less, or 1% by weight or less relative to the total amount of a first fluorescent material and a second fluorescent material.

The resin in the fluorescent member may include a thermoplastic resin or a thermosetting resin. Specific examples of the thermosetting resin include an epoxy resins and a silicone resin. The fluorescent member may contain another component as necessary in addition to a fluorescent material and a resin. Examples of the other component include a filler such as silica, barium titanate, titanium oxide, and aluminium oxide; a light stabilizer; and a colorant.

When the fluorescence member contains another component, for instance, a filler, the amount contained may be from 0.01 part by weight to 20 parts by weight relative to 100 parts by weight of the resin.

EXAMPLES

Hereinafter, the Examples of the present disclosure will be specifically described, but the present disclosure is by no means limited to these Examples.

Example 1

Calcium nitride ($Ca_3N_2$), silicon nitride ($Si_3N_4$), elemental silicon (Si), aluminium nitride (AlN), and europium oxide ($Eu_2O_3$), which constitute a raw material compound, were weighed so as to have a molar ratio of Ca:Si:Al:Eu=0.993:1.1:0.9:0.007, and mixed. Here, silicon nitride and elemental silicon were mixed so that the silicon nitride constitutes 41.6% by weight and elemental silicon constitutes 58.4% by weight. The resultant mixed raw material was charged into a crucible made of boron nitride, and heat-treated in a nitrogen atmosphere under the pressure of 0.92 MPa (gauge pressure) at 2000° C. for 2 hours to obtain a nitride fluorescent material.

Example 2

A nitride fluorescent material was obtained in the same manner as Example 1 except that the mixing ratio of silicon nitride to elemental silicon was changed so that silicon nitride constitutes 37.5% by weight and elemental silicon constitutes 62.5% by weight.

Example 3

A nitride fluorescent material was obtained in the same manner as Example 1 except that the mixing ratio of silicon nitride to elemental silicon was changed so that silicon nitride constitutes 20.5% by weight and elemental silicon constitutes 79.5% by weight.

Example 4

A nitride fluorescent material was obtained in the same manner as Example 1 except that the mixing ratio of silicon nitride to elemental silicon was changed so that silicon nitride constitutes 70.6% by weight and elemental silicon constitutes 29.4% by weight.

Example 5

A nitride fluorescent material was obtained in the same manner as Example 1 except that the mixing ratio of silicon nitride to elemental silicon was changed so that silicon nitride constitutes 84.4% by weight and elemental silicon constitutes 15.6% by weight.

Comparative Example 1

A nitride fluorescent material was obtained in the same manner as Example 1 except that silicon nitride alone was used without using elemental silicon.

Comparative Example 2

A nitride fluorescent material was obtained in the same manner as Example 1 except that elemental silicon alone was used without using silicon nitride.

The resultant nitride fluorescent materials were evaluated for the following points.

Average Particle Diameter:

Samples of 1 cm³ were weighed using a Fisher Sub Sieve Sizer (F.S.S.S.) under the conditions of a temperature of 25° C. and a humidity of 70% RH. Each sample was packed into a dedicated tubular container, into which dried air of a given pressure is flown. For each sample, the specific surface area is determined from the difference in pressure, and the average particle diameter was calculated.

Specific Surface Area

For each nitride fluorescent material, the specific surface area was calculated by the dynamic constant-pressure method using Gemini 2370 manufactured by Shimadzu Corporation in accordance with the instruction manual.

Light Emitting Properties

The light emission spectrum of each nitride fluorescent material when excited at 460 nm was measured using F-4500 manufactured by Hitachi High-Technologies Corporation. The energy value: ENG (%) and peak emission wavelength: $\lambda p$ (nm) of the resultant light emission spectrum were calculated.

Figure 2:
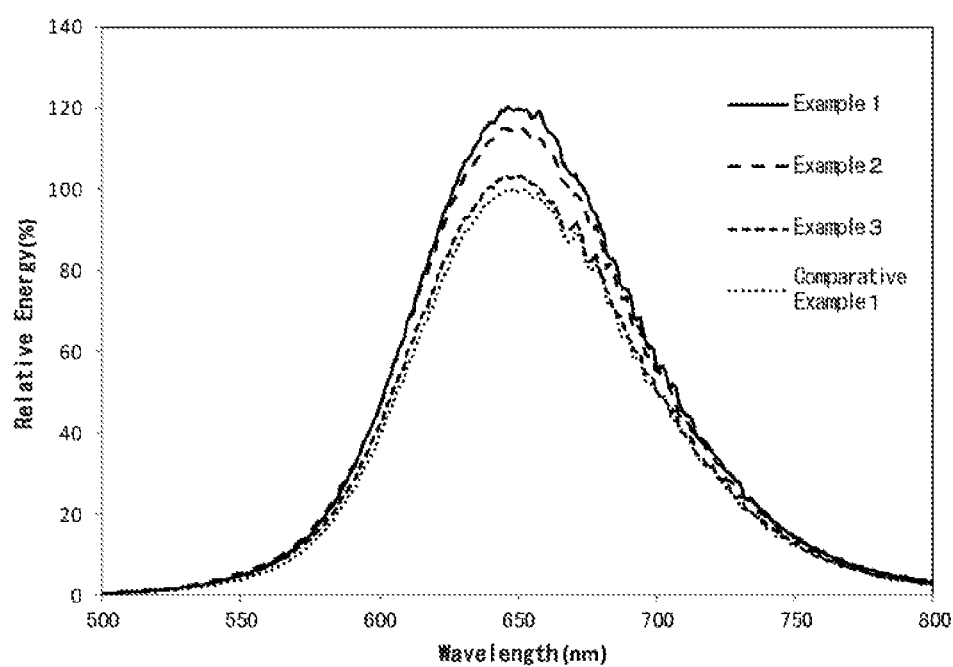
FIG. 2 is an example of a light emission spectrum of relative energy versus wavelength for a nitride fluorescent material according to the present embodiment.

Table 1 shows the average particle diameter, specific surface area, $\lambda p$, ENG (%) of each nitride fluorescent material. Each ENG (%) is a relative value when the energy value of the nitride fluorescent material of Comparative Example 1 is taken as 100%. FIG. 2 shows light emission spectra.

TABLE 1

| | Weight percentages of Si material (%) | | Average particle diameter | Specific surface area | Light emitting properties | |
|---|---|---|---|---|---|---|
| | Si | Si$_3$N$_4$ | (μm) | (m²/g) | $\lambda p$ (nm) | ENG (%) |
| Example 1 | 58.4 | 41.6 | 23.0 | 0.11 | 646 | 118.9 |
| Example 2 | 37.5 | 62.5 | 23.0 | 0.13 | 651 | 115.4 |
| Example 3 | 20.5 | 79.5 | 19.5 | 0.16 | 649 | 104.0 |
| Example 4 | 70.6 | 29.4 | 20.5 | 0.11 | 649 | 114.9 |
| Example 5 | 84.4 | 15.6 | 23.0 | 0.27 | 653 | 102.3 |
| Comparative Example 1 | 0 | 100 | 17.0 | 0.23 | 652 | 100.0 |
| Comparative Example 2 | 100 | 0 | 27.5 | 0.30 | 653 | 98.1 |

Comparative Example 1 is a fluorescent material using no elemental silicon and calcinated at 2000° C., and the ENG value of Comparative Example 1 serves as the reference. In Examples 1 to 5 where silicon nitride and elemental silicon were used in combination, specific surface areas were each less than 0.3 m²/g, the average particle diameters were each 18 μm or more, and ENGs were high, so that light emitting properties were superior.

Figure 3:
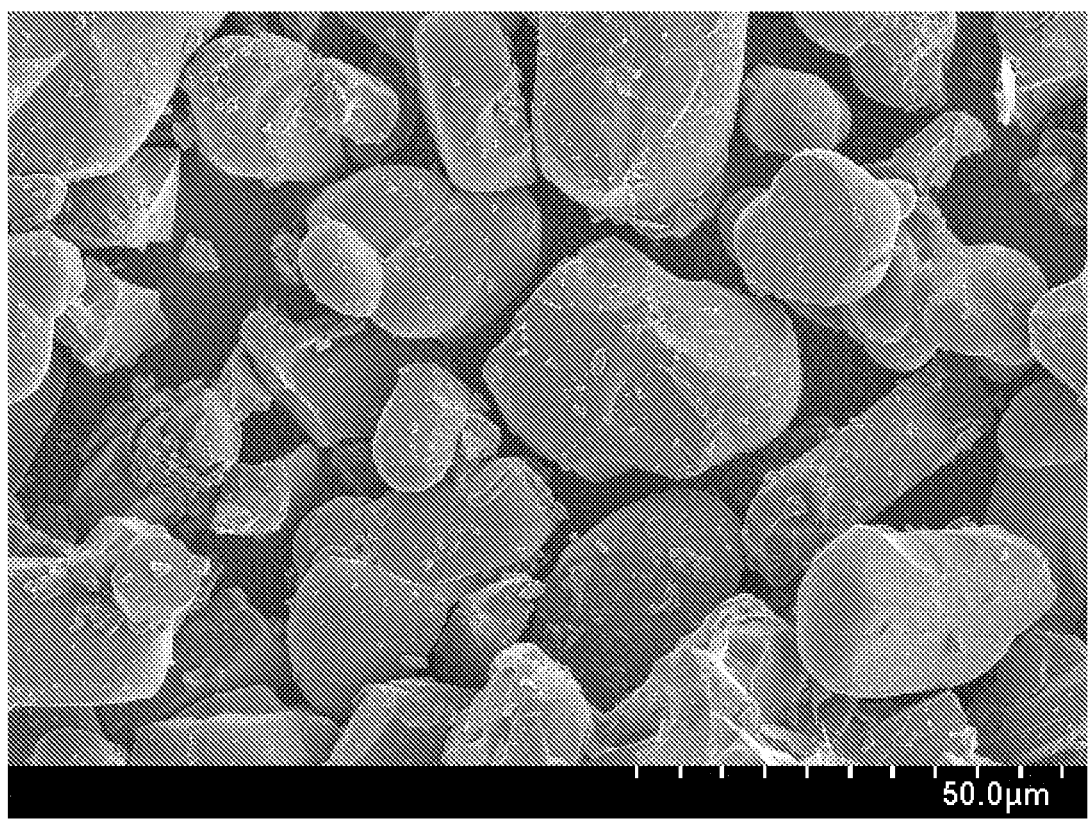
FIG. 3 is a scanning electron microscope (SEM) image of a nitride fluorescent material according to Comparative Example 1.
Figure 4:
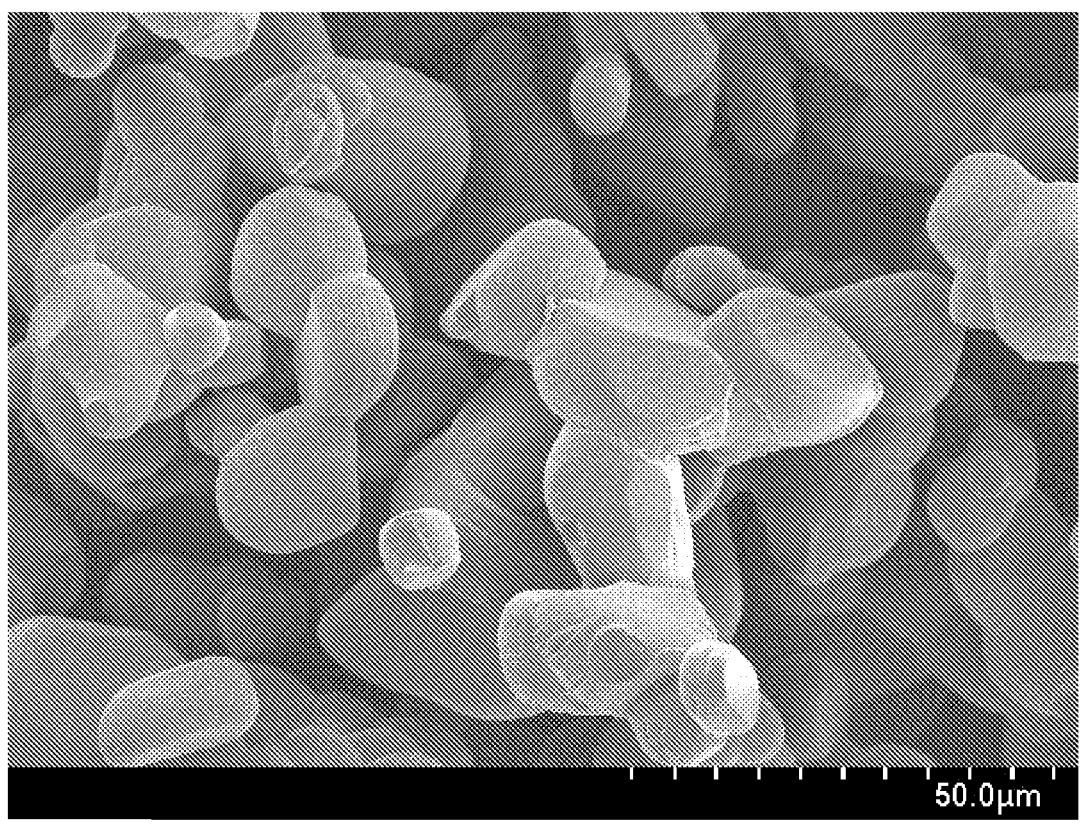
FIG. 4 is an SEM image of a nitride fluorescent material according to Example 1.

FIGS. 3 and 4 show scanning electron microscope (SEM) images of the nitride fluorescent materials of Comparative Example 1 and Example 1. In Comparative Example 1 shown in FIG. 3, large particles and fine particles are mixed. This is believed to be due to the fact that particles are sintered together when calcinated at a high temperature, and these particles are ground together during grinding process for dispersion to yield finer microparticles. In Example 1 as shown in FIG. 4, no such microparticles are present, because less grinding of particles occurred when the calcinated products were ground due to less sintering. The particles of the nitride fluorescent material of Example 1 suffer little damage during grinding process, so that the surfaces of particles are smooth as shown in FIG. 4, achieving high ENG because of no mixture of microparticles with lower emitting luminance. A light emitting device containing a nitride fluorescent material of the present Examples are also believed to contain little microparticles that causes Rayleigh scattering, so that scattering of light emitted from the light emitting element towards the inside of the light emitting device (light emitting element) is minimized, accelerating scattering of light towards the outside of the light emitting device, i.e., the surface for taking out light (e.g., Mie scattering), achieving a light emitting device having high emitting efficiency.

This is believed to be attributable to the fact that, for instance, by using silicon nitride and elemental silicon in combination as raw materials, the amount of oxygen is reduced and thus sintering is suppressed compared to the case where silicon nitride alone is used, and change in volume that occurs when silicon turns into silicon nitride is also utilized to promote particle growth and reduce susceptibility to sintering.

In contrast, in Comparative Example 2 where no silicon nitride is used, the particle diameter and specific surface area are larger and ENG is lower. Since the formation of the fluorescent material and the nitriding of silicon are performed simultaneously, silicon is believed to be nitrided insufficiently, resulting in poor properties. Using silicon nitride and elemental silicon in combination accelerates nitriding of silicon, which is believed to produce this difference.

Example 6

A nitride fluorescent material was obtained in the same manner as Example 1 except that strontium nitride was used as a strontium compound, that the composition of the raw material mixture was changed so as to have a molar ratio of Sr:Ca:Si:Al:Eu=0.099:0.891:1.1:0.9:0.01, and that the ratio of silicon nitride to elemental silicon was 37.5% by weight to 62.5% by weight.

Comparative Example 3

A nitride fluorescent material was obtained in the same manner as Example 6 except that silicon nitride alone without elemental silicon was used.

Figure 5:
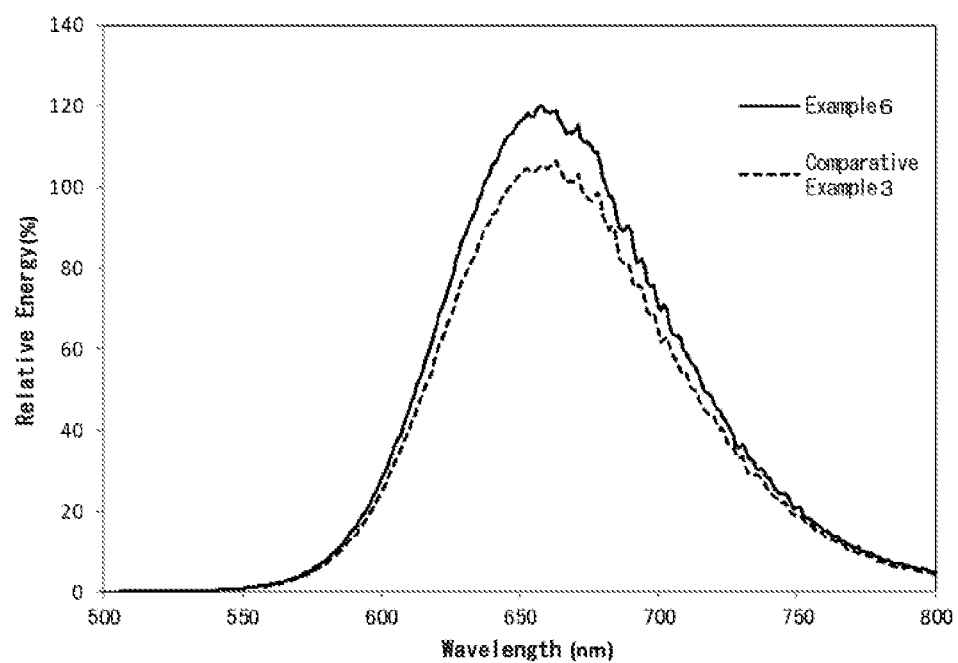
FIG. 5 is an example of light emission spectrum of relative energy versus wavelength for a nitride fluorescent material according to the present embodiment.

The resultant nitride fluorescent materials were evaluated in the same manner as described above. Table 2 shows the average particle diameter, specific surface area, $\lambda p$, and ENG (%) of each nitride fluorescent material. ENG (%) is a relative value when the energy value of the nitride fluorescent material of Comparative Example 1 is taken as 100%. FIG. 5 shows resultant light emission spectra.

TABLE 2

| | Weight percentages of Si material (%) | | Average particle diameter | Specific surface area | Light emitting properties | |
|---|---|---|---|---|---|---|
| | Si | Si$_3$N$_4$ | (μm) | (m²/g) | $\lambda p$ (nm) | ENG (%) |
| Example 6 | 37.5 | 62.5 | 22.0 | 0.16 | 657 | 111.3 |
| Comparative Example 3 | 0.0 | 100.0 | 19.5 | 0.31 | 663 | 99.5 |

As shown in Table 2 and FIG. 5, Example 6 has a peak emission wavelength of 657 nm, and Comparative Example 3 has a peak emission wavelength of 663 nm, both of which are longer than that of Example 1. This is believed to reflect changes in the amount of Eu. Like Examples 1 to 5, Example 6 also has a specific surface area of as small as 0.2 m²/g or less, as a result of elemental silicon being added to the raw materials, and has higher light emitting properties than Comparative Example 3, demonstrating good results.

A light emitting device including a nitride fluorescent material obtained by a method for producing according to the present embodiment may be suitably used as, for example, a light source for lighting. In particular, the light emitting device may be suitably used for a light source for lighting, LED displays, backlight light sources, traffic signals, illuminated switches, and various indicators. Since a nitride fluorescent material having a high emitting luminance, for example, is obtained, the industrial applicability is significantly high.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
   a fluorescent member comprising a first fluorescent material; and
   a light emitting element having a peak emission wavelength in a range of from 380 nm to 470 nm,
   wherein the first fluorescent material comprises an alkali earth metal, aluminium, silicon, and europium, and having a specific surface area by a Brunauer-Emmett-Teller (BET) method of from 0.1 m²/g to 0.16 m²/g and an average particle diameter of 20 μm or more and less than 30 μm,
   wherein the first fluorescent material has a composition represented by formula (I):

   $Sr_sCa_tAl_uSi_vN_w:Eu$ (I), wherein s, t, u, v, and w respectively satisfy $0 \le s < 1$, $0 < t \le 1$, $s+t \le 1$, $0.9 \le u \le 1.1$, $0.9 \le v \le 1.1$, and $2.5 \le w \le 3.5$, and
   wherein the BET method is a dynamic constant-pressure and single point BET method using nitrogen gas as an adsorption gas.

2. The light emitting device according to claim 1, wherein the first fluorescent material has a specific surface area by the BET method of from 0.1 m²/g to 0.15 m²/g.

3. The light emitting device according to claim 1, wherein s=0 in formula (I).

4. The light emitting device according to claim 1, wherein the first fluorescent material is a crystalline structure in 50% by weight or more.

5. The light emitting device according to claim 1, wherein the fluorescent member further comprises a resin, and
   wherein a content of the first fluorescent material is from 0.1 part by weight to 50 parts by weight relative to 100 parts by weight of the resin.

6. The light emitting device according to claim 1, wherein the light emitting device emits a light having chromaticity coordinates defined by CIE 1931 of x=0.220 to 0.340 and y=0.160 to 0.340.

7. The light emitting device according to claim 1, wherein the light emitting element is a nitride gallium compound semiconductor.

8. The light emitting device according to claim 1, wherein the fluorescent member further comprises a second fluorescent material having a peak emission wavelength in a range of from 500 nm to 580 nm.

9. The light emitting device according to claim 8, wherein the second fluorescent material is at least one selected from the group consisting of a β sialon fluorescent material; a silicate fluorescent material; a halosilicate fluorescent material; a thiogallate fluorescent material; a rare earth aluminate fluorescent material; an alkaline earth aluminate fluorescent material; and an alkaline earth phosphate fluorescent material.

10. The light emitting device according to claim 8, wherein the second fluorescent material is at least one selected from the group consisting of a β sialon fluorescent material having a composition represented by formula (IIa); a silicate fluorescent material having a composition represented by formula (IIb); a halosilicate fluorescent material having a composition represented by formula (IIc); a thiogallate fluorescent material having a composition represented by formula (IId); a rare earth aluminate fluorescent material having a composition represented by formula (IIe); an alkaline earth aluminate fluorescent material represented by formula (IIf); and an alkaline earth phosphate fluorescent material represented by formula (IIg):

$Si_{6-w}Al_wO_wN_{8-w}:Eu$ (IIa), wherein $0 < w \le 4.2$;

$(Ba,Sr,Ca,Mg)_2SiO_4:Eu$ (IIb);

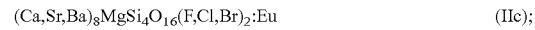
$(Ca,Sr,Ba)_8MgSi_4O_{16}(F,Cl,Br)_2:Eu$ (IIc);

$(Ba,Sr,Ca)Ga_2S_4:Eu$ (IId);

$(Y,Lu,Gd)_3(Al,Ga)_5O_{12}:Ce$ (IIe);

$(Sr,Ca,Ba)_4Al_{14}O_{25}:Eu$ (IIf);

$(Ca,Sr,Ba)_5(PO_4)_3(Cl,Br):Eu$ (IIg).

* * * * *